United States Patent
Lee et al.

(10) Patent No.: US 10,094,887 B2
(45) Date of Patent: Oct. 9, 2018

(54) AUXILIARY POWER SUPPLY TEST METHODS AND ELECTRONIC APPARATUS USING THE SAME

(71) Applicant: Samsung Electronics Co., Ltd., Suwon-si, Gyeonggi-do (KR)

(72) Inventors: Woo-sung Lee, Seoul (KR); Hyoung-taek Lim, Seoul (KR); Chung-hyun Ryu, Hwaseong-si (KR); Jong-wook Jeong, Hwaseong-si (KR); Su-yong An, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 15/185,331

(22) Filed: Jun. 17, 2016

(65) Prior Publication Data
US 2017/0067968 A1    Mar. 9, 2017

(30) Foreign Application Priority Data
Sep. 3, 2015   (KR) .......................... 10-2015-0124946

(51) Int. Cl.
*G01R 31/40* (2014.01)
*G01R 31/36* (2006.01)
*H02J 7/00* (2006.01)

(52) U.S. Cl.
CPC ......... *G01R 31/40* (2013.01); *G01R 31/3631* (2013.01); *H02J 7/0093* (2013.01)

(58) Field of Classification Search
None
See application file for complete search history.

(56) References Cited

U.S. PATENT DOCUMENTS

| | | | |
|---|---|---|---|
| 6,100,672 A * | 8/2000 | Siponen | H02J 7/0077 320/150 |
| 6,859,011 B2 | 2/2005 | Tscheternigg et al. | |
| 8,373,424 B2 | 2/2013 | Kawamura | |
| 8,638,634 B2 | 1/2014 | Hauck | |
| 9,024,592 B2 | 5/2015 | Jeon et al. | |
| 2013/0268217 A1 | 10/2013 | Kim et al. | |

(Continued)

FOREIGN PATENT DOCUMENTS

| | | |
|---|---|---|
| JP | 10-224980 | 8/1998 |
| JP | 2004-284379 | 10/2004 |
| JP | 2006-197790 | 7/2006 |

(Continued)

*Primary Examiner* — Paresh Patel
(74) *Attorney, Agent, or Firm* — Ward and Smith, P.A.

(57) ABSTRACT

Provided are an auxiliary power supply test method and an electronic apparatus to which the same is applied. The auxiliary power supply test method includes: applying a charging disable signal, which interrupts a charging operation by an auxiliary power supply unit for a predetermined period of time, to the auxiliary power supply unit; monitoring a charging voltage of the auxiliary power supply unit in a time interval in which the charging disable signal is applied to the auxiliary power supply unit; determining whether the auxiliary power supply unit is defective, based on whether the monitored charging voltage is less than a predetermined threshold voltage, wherein the auxiliary power supply unit supplies auxiliary power, obtained based on the charging voltage, to a system power supply line in a case of a sudden power-off.

20 Claims, 14 Drawing Sheets

(56) References Cited

U.S. PATENT DOCUMENTS

2013/0289854 A1 10/2013 Takahashi et al.
2013/0328522 A1* 12/2013 Brockman ......... G01R 31/3606
  320/107

FOREIGN PATENT DOCUMENTS

| KR | 1020100074415 A | 7/2010 |
| KR | 1020120120706 A | 11/2012 |
| KR | 1020130042083 A | 4/2013 |

* cited by examiner

AUXILIARY POWER SUPPLY TEST METHODS AND ELECTRONIC APPARATUS USING THE SAME

CROSS-REFERENCE TO RELATED APPLICATION

This application claims the benefit of Korean Patent Application No. 10-2015-0124946, filed on Sep. 3, 2015, in the Korean Intellectual Property Office, the disclosure of which is incorporated herein in its entirety by reference.

BACKGROUND

The present disclosure relates an electronic apparatus using auxiliary power supplies and methods of testing the same, and more particularly, to auxiliary power supply test methods and electronic apparatus using the same.

An electronic apparatus for processing data may employ an auxiliary power supply apparatus to help prevent data loss that may occur when a main power supply unit to the electronic apparatus is suddenly powered off. If an abnormality is present in the auxiliary power supply unit and a sudden power-off occurs, data loss may occur.

SUMMARY

The inventive concepts provide a method of testing an auxiliary power supply unit and an electronic apparatus configured to efficiently test whether an auxiliary power supply unit is normally operated.

According to some aspects of the inventive concepts, there is provided an auxiliary power supply test method including: applying a charging disable signal to a auxiliary power supply unit for a predetermined period of time, the charging disable signal disabling a charging operation of the auxiliary power supply unit; monitoring a charging voltage of the auxiliary power supply unit during the predetermined period of time in which the charging disable signal is applied to the auxiliary power supply unit; and determining whether the auxiliary power supply unit is defective, based on whether the monitored charging voltage falls below a predetermined threshold voltage, wherein the auxiliary power supply unit is configured to supply auxiliary power, obtained based on the charging voltage, to a system power supply line in the event of loss of a main supply voltage.

According to further aspects of the inventive concepts, there is provided an electronic apparatus including: an auxiliary power supply unit configured to store electric energy and, if a main power supply is lost, to supply auxiliary power, which is obtained based on the stored electric energy, to a system power supply line; and a processor configured to control operation of the auxiliary power supply unit and a memory unit, by using power supplied to the system power supply line, wherein the processor repeatedly applies a charging enable signal and a charging disable signal to the auxiliary power supply unit, determines whether a charging voltage of the auxiliary power supply unit is less than a predetermined threshold voltage during a time interval in which the charging disable signal is applied to the auxiliary power supply unit, and generates a signal indicating whether the auxiliary power supply unit is defective in response to determining whether the charging voltage of the auxiliary power supply unit falls below a predetermined threshold voltage during the time interval in which the charging disable signal is applied to the auxiliary power supply unit.

According to further aspects of the inventive concepts, a method of operating an auxiliary power supply unit includes transmitting a charging disable signal to an auxiliary power supply unit, the charging disable signal disabling a charging operation of the auxiliary power supply unit; starting a timer; monitoring a charging voltage generated by the auxiliary power supply unit; and determining if a value of the timer is greater than a timer threshold value. The method further includes, in response to determining that the value of the timer is greater than the timer threshold value, applying a charging enable signal to an auxiliary power supply unit, the charging enable signal enabling the charging operation of the auxiliary power supply unit; in response to determining that the value of the timer is less than the timer threshold value, determining if the charging voltage of the auxiliary power supply unit has fallen below a predetermined threshold voltage; and in response to determining that the charging voltage of the auxiliary power supply unit has fallen below the predetermined threshold voltage, generating a backup fail signal BUP_FA that indicates that the auxiliary power supply unit is defective.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
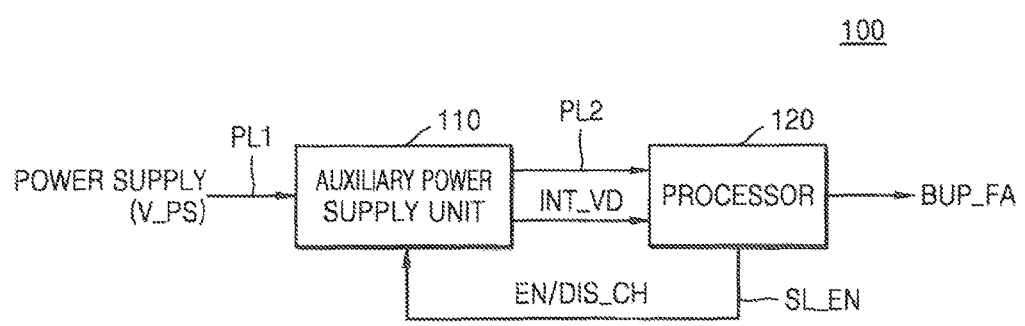
FIG. 1 is a block diagram of an example of an auxiliary power supply test apparatus according to an exemplary embodiment.

Exemplary embodiments will now be described more fully with reference to the accompanying drawings. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art. As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. Like reference numerals in the drawings denote like elements, and thus their description will be omitted. In the drawings, the lengths and sizes of layers and regions are exaggerated for clarity.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of an example of an auxiliary power supply test apparatus 100 according to an exemplary embodiment.

Referring to FIG. 1, the auxiliary power supply test apparatus 100 includes an auxiliary power supply unit 110 and a processor 120.

The auxiliary power supply unit 110 stores electric energy provided by a main power supply connected to a first power supply line PL1 and supplies auxiliary power to a second power supply line PL2. The auxiliary power is generated from the stored electric energy. A system that includes the processor 120 may operate using power supplied to the second power supply line PL2. Accordingly, the second power supply line PL2 may be referred to as a system power supply line.

The auxiliary power supply unit 110 stores electric energy in an energy storage device when main power is being supplied to the auxiliary power supply unit via the first power supply line PL1. Additionally, when main power is being supplied to the auxiliary power supply unit via the first power supply line PL1, the auxiliary power supply unit 110 enables the main power to be output to the second power supply line PL2, and disables the auxiliary power from being output to the second power line PL2.

If main power is not being supplied to the auxiliary power supply unit 110 via the first power supply line PL1, the auxiliary power supply unit 110 disables output of the main power to the second power supply line PL2, and enables the auxiliary power to be output to the second power supply line PL2. For example, in the event of a sudden power-off of a main power supply, main power may not be supplied to the auxiliary power supply unit 110 via the first power supply line PL1. A sudden power-off of main power may occur when voltage V_PS output by a main power supply abruptly falls below a predetermined minimum operating voltage level.

The processor 120 includes hardware and/or software for controlling the auxiliary power supply unit 110 and testing the auxiliary power supply unit 110.

During a normal operation mode, the processor 120 transmits a charging enable signal EN_CH to the auxiliary power supply unit 110. In an auxiliary power supply test mode, the processor 120 transmits a charging disable signal DIS_CH to the auxiliary power supply unit 110. As an example, the charging enable signal EN_CH and the charging disable signal DIS_CH may be transmitted to the auxiliary power supply unit 110 via an enable signal line SL_EN. In particular, a signal transmitted on the enable signal line SL_EN may have a first logical state or a second logical state. The first logical state may correspond to the charging enable signal EN_CH while the second logical state may correspond to the charging disable signal DIS_CH. For example, if the first logical state is logical "HIGH", the second logical state may be logical "LOW". Conversely, if the first logical state is logical "LOW", the second logical state may be logical "HIGH".

If the main power is being supplied on the first power supply line PL1, the processor 120 receives the main power via the second power line PL2. If the main power is not being supplied on the first power supply line PL1, the processor 120 receives the auxiliary power from the auxiliary power supply unit 110 via the second power line PL2.

The processor 120 may determine a length of time for which the charging disable signal DIS_CH should be applied in an auxiliary power test mode. In some embodiments, the length of time for which the charging disable signal DIS_CH is applied in an auxiliary power test mode may be determined as a length of time in which a level of an auxiliary voltage that is generated by the auxiliary power supply unit 110 when it is not being charged by the main power supply should remain energy storage device higher than a predetermined threshold voltage level. In some cases, the predetermined threshold voltage level corresponds to a level of a proof voltage, or minimum operating voltage, that can be used as an auxiliary power supply voltage.

That is, when the main power is being supplied on the first power supply line PL1, the auxiliary power supply unit 110 causes the main power to be output on the second power supply line PL2, and disables the output of auxiliary power on energy storage device the second power line PL2. When this occurs, the energy storage device in the auxiliary power supply unit naturally discharges over a period of time. The length of time that it takes for the energy storage device can decrease if the energy storage device suffers a fault, as will be described in more detail below. As an example, the energy storage device may include one or more capacitors. The energy storage device may be referred to as a backup capacitor.

In the auxiliary power supply test mode, the auxiliary power supply unit 110 monitors a charging voltage that is generated based on electric energy stored in the energy storage device. If the auxiliary power supply unit 110 detects that the charging voltage is less than a predetermined threshold voltage (Vth), the auxiliary power supply unit 110 generates an auxiliary power interrupt signal INT_VD, and transmits the generated auxiliary power interrupt signal INT_VD to the processor 120. As an example, the auxiliary power interrupt signal INT_VD may be transmitted to the processor 120 as a pulse signal.

If the processor 120 receives the auxiliary power interrupt signal INT_VD, the processor 120 generates a backup fail signal BUP_FA that indicates that the auxiliary power supply unit 110 is defective. In particular, the backup fail signal BUP_FA that indicates that the auxiliary power supply unit 110 is defective may indicate that an open fault has occurred in the energy storage device in the auxiliary power supply unit 110. If the processor 120 determines the auxiliary power supply unit 110 is defective, the processor 120 may continuously transmit a charging disable signal DIS_CH to the auxiliary power supply unit 110. This may prevent occurrence of a quality problem in circuit devices with respect to charging operations which may be caused by an open fault in the energy storage device in the auxiliary power supply unit 110.

If the auxiliary power supply unit 110 is not determined to be defective, the processor 120 may repeatedly execute an auxiliary power supply test. Since an open fault in the energy storage device in the auxiliary power supply unit 110 may occur even after the device has previously operated properly, it may be desirable for the processor 120 to repeatedly execute an auxiliary power supply test to identify a subsequent fault.

In other words, the processor 120 may repeatedly transmit a charging enable signal EN_CH and a charging disable signal DIS_CH to the auxiliary power supply unit 110, monitor a charging voltage generated by the auxiliary power supply unit 110 in the auxiliary power supply test mode while the charging disable signal DIS_CH is being transmitted to the processor 120, and determine whether an open fault has occurred in the energy storage device in the auxiliary power supply unit 110. In some embodiments, the auxiliary power supply test may be executed at a period of time that is predetermined in a user environment.

Figure 2:
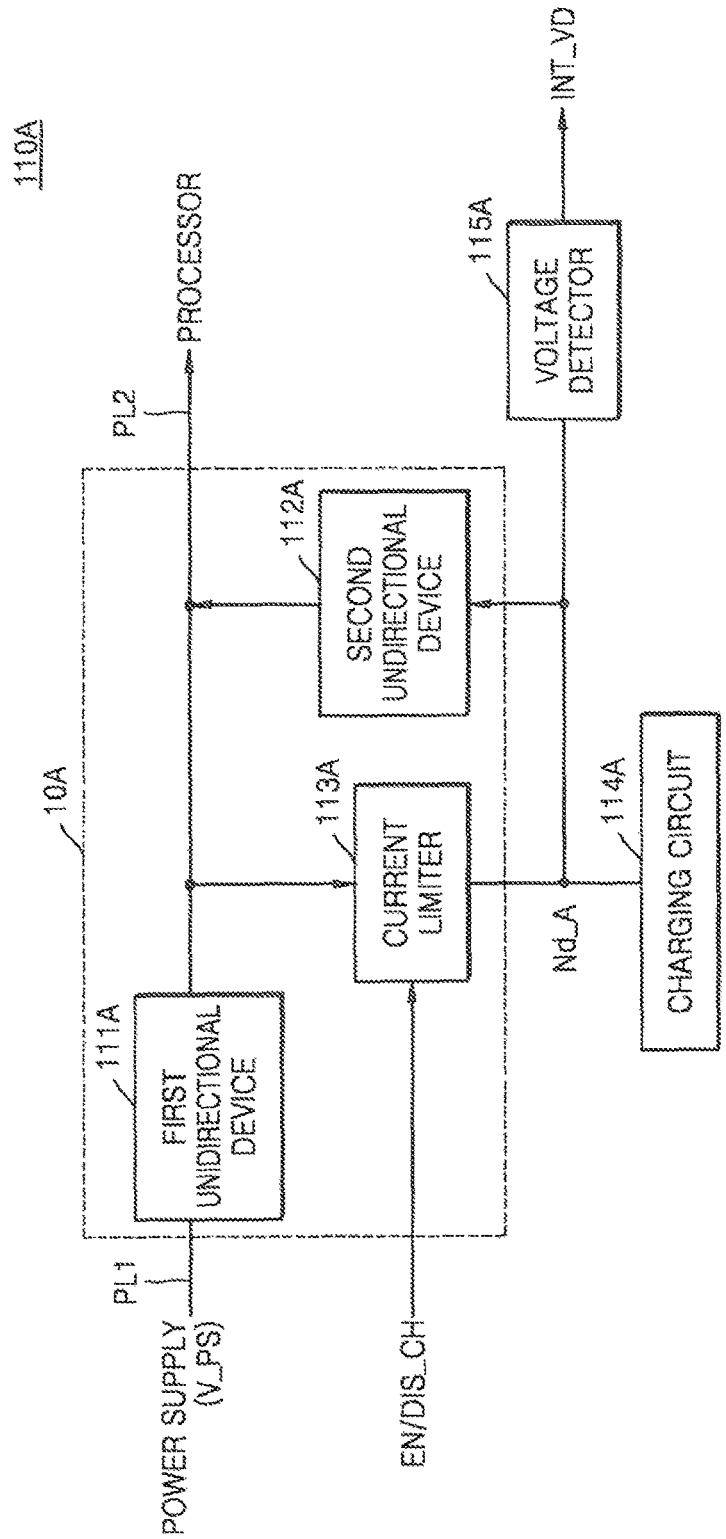
FIG. 2 is a block diagram of an example of the auxiliary power supply test apparatus shown in FIG. 1.

FIG. 2 is a block diagram of an auxiliary power supply unit 110A, which is as an example of the auxiliary power supply unit 110 shown in FIG. 1.

Referring to FIG. 2, the auxiliary power supply unit 110A includes a first unidirectional device 111A, a second unidirectional device 112A, a current limiter 113A, a charging circuit 114A, and a voltage detector 115A. A circuit that includes the first unidirectional device 111A, the second unidirectional device 112A, and the current limiter 113A may be referred to as a current control circuit 10A.

The current control circuit 10A supplies current from the main power supply to the charging circuit 114A and manages a current path that supplies current from the charging circuit 114A to the second power supply line PL2.

The first unidirectional device 111A is connected to the main power supply via the first power supply line PL1, and is connected to a system that includes the processor 120 via the second power supply line PL2.

As an example, the first unidirectional device 111A may form a current path extending from the first power supply line PL1 to the second power supply line PL2 based on a voltage level difference between the first power supply line PL and the second power supply line PL2. In other words, if a voltage level of the first power supply line PL1 is higher than a voltage level of the second power supply line PL2 by at least a threshold voltage level, a current path is formed from the first power supply line PL1 to the second power supply line PL2. In embodiments in which the first unidirectional device 111A includes a diode, the threshold voltage may be a forward voltage drop of the diode. However, if a voltage level of the first power supply line PL is not higher than a voltage level of the second power supply line PL2 by at least the threshold voltage level, a current path from the first power supply line PL1 to the second power supply line PL2 may be obstructed.

As another example, the first unidirectional device 111A may form a current path from the first power supply line PL1 to the second power supply line PL2 based on a voltage level of the first power supply line PL1. In other words, if a voltage level of the first power supply line PL1 is equal to or higher than a predetermined voltage level, the current path may be formed. However, if a voltage level of the first power supply line PL1 is lower than the predetermined voltage level, the current path may be obstructed. A reference voltage level that is used to detect a sudden power-off may be used as the predetermined voltage.

If a voltage of the main power supply is normally applied to the first power supply line PL1, the first unidirectional device 111A may form a current path so that current flows from the first power supply line PL1 to the second power supply line PL2. In other words, if a voltage level of the main power supply is equal to or higher than a predetermined voltage level, the first unidirectional device 111A may form a current path so that current flows from the first power supply line PL1 to the second power supply line PL2.

If a voltage level of the main power supply is decreased to a level equal to or less than the predetermined voltage level, for example in the event of a sudden power-off of the main power supply, the first unidirectional device 111A may obstruct the current path. As an example, the first unidirectional device 111A may be implemented as a diode or a metal oxide silicon field effect transistor (MOSFET).

The second unidirectional device 112A is connected between the charging circuit 114A and the second power supply line PL2. As an example, the second unidirectional device 112A may form a current path in response to a difference between a charging voltage level of the charging circuit 114A and a voltage level of the second power supply line PL2. In other words, if a charging voltage level of the charging circuit 114A is higher than a voltage level of the second power supply line PL2 by at least a threshold voltage level, a current path from the charging circuit 114A to the second power supply line PL2 may be formed. However, if a charging voltage level of the charging circuit 114A is not higher than a voltage level of the second power supply line PL2, the current path may be obstructed. In embodiments in which the second unidirectional device 112A includes a diode, the threshold voltage may be a forward voltage drop of the diode.

As another example, the second unidirectional device 112A may form a current path based on a voltage level of the second power supply line PL2. In other words, if a voltage level of the second power supply line PL2 is lower than a predetermined voltage level, a current path may be formed. However, if a voltage level of the second power supply line PL2 is equal to or higher than the predetermined voltage level, a current path may be obstructed. For example, a reference voltage level used to detect a sudden power-off may be used as the predetermined voltage.

If a voltage level of the main power supply decreases to a level below a predetermined voltage level, for example in the event of a sudden power-off, the second unidirectional device 112A forms a current path from the charging circuit 114A to the second power supply line PL2 based on a charging voltage level of the charging circuit 114A. Thus, the second unidirectional device 112A can supply auxiliary power to a system, which includes the processor 120, in the event of a sudden power-off of a main supply voltage using energy stored in the charging circuit 114A. In some embodiments, the second unidirectional device 112A may be implemented as a diode or an MOSFET.

The current limiter 113A is connected between the charging circuit 114A and the second power supply line PL2. The current limiter 113A may protect the charging circuit 114A. For example, the current limiter 113A may prevent or reduce overcurrent from flowing into the charging circuit 114A. The current limiter 113A may supply a current having a level that is equal to or less than a level of predetermined maximum current to the charging circuit 114A during a time interval in which a charging enable signal EN_CH is transmitted to the auxiliary power supply unit 110. Additionally, the current limiter 113A may disable a supply of current to the charging circuit 114A during a time interval in which a charging disable signal DIS_CH is applied to the auxiliary power supply unit 110.

The charging circuit 114A stores electrical energy in response to a supply current that is input via the first unidirectional device 111A and the current limiter 113A. In some embodiments, the energy storage device 114A may include one or more capacitors. The energy storage device 114A may be referred to as a backup capacitor.

The voltage detector 115A is connected to the charging circuit 114A. If a charging voltage of a node A Nd_A of the charging circuit 114A is detected during the auxiliary power supply test mode as being less than a predetermined threshold voltage, the voltage detection unit 114A generates an auxiliary power interrupt signal INT_VD. In other words, the voltage detector 115A detects a charging voltage of the node A Nd_A and, if the detected charging voltage is less than a predetermined threshold voltage, the voltage detector 115A generates an auxiliary power interrupt signal INT_VD. As an example, the auxiliary power supply interrupt signal INT_VD may be generated in the form of a pulse.

Figure 3:
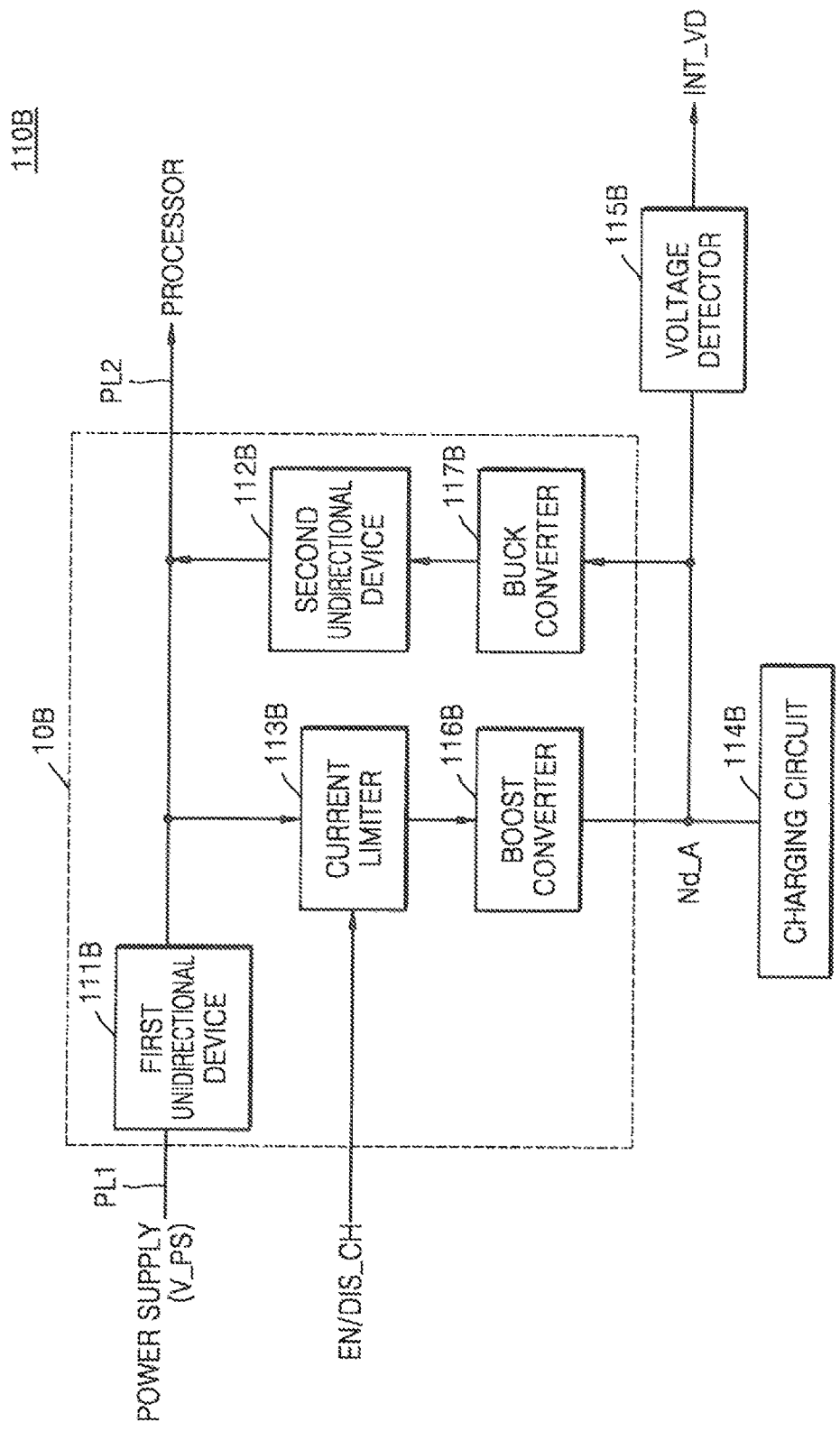
FIG. 3 is a block diagram of another example of the auxiliary power supply test apparatus shown in FIG. 1.

FIG. 3 is a block diagram of an auxiliary power supply unit 110B as another example of the auxiliary power supply unit 110 shown in FIG. 1.

Referring to FIG. 3, the auxiliary power supply unit 110B includes a first unidirectional device 111B, a second unidirectional device 112B, a current limiter 113B, a charging circuit 114B, and a voltage detector 115B, a boost converter 116B, and a buck converter 117B. A circuit that includes the first unidirectional device 111B, the second unidirectional device 112B, the current limiter 113B, the boost converter 116B, and the buck converter 117B may be referred to as a current control circuit 10B.

The current control circuit 10B supplies current from a main power supply to the charging circuit 114B and manages a current path that supplies current from the charging circuit 114B to the second power supply line PL2.

The first unidirectional device 111B is connected to the main power supply via the first power supply line PL1, and to a system that includes the processor 120 via the second power supply line PL2.

As an example, the first unidirectional device 111B may form a current path extending from the first power supply line PL1 to the second power supply line PL2 in response to a voltage level difference between the first power supply line PL1 and the second power supply line PL2. In other words, if a voltage level of the first power supply line PL1 is higher than a voltage level of the second power supply line PL2 by at least a threshold voltage level, a current path may be formed from the first power supply line PL1 to the second power supply line PL2. However, if a voltage level of the first power supply line PL1 is not higher than a voltage level of the second power supply line PL2 by at least the threshold voltage level, the current path from the first power supply line PL to the second power supply line PL2 may be obstructed.

As an example, the first unidirectional device 111B may form a current path extending from the first power supply line PL1 to the second power supply line PL2 based on a voltage level of the first power supply line PL1. In other words, if a voltage level of the first power supply line PL1 is equal to or higher than a predetermined voltage level, a current path may be formed. However, if a voltage level of the first power supply line PL1 is lower than the predetermined voltage level, a current path may be obstructed.

If a power supply voltage V_PS is applied to the first power supply line PL1, the first unidirectional device 111B forms a current path so that current flows from the first power supply line PL1 to the second power supply line PL2. In other words, if a voltage level of the main power supply is equal to or higher than a predetermined voltage level, the first unidirectional device 111BA forms a current path so that current flows from the first power supply line PL1 to the second power supply line PL2.

If a main power supply voltage level V_PS decreases to a level below a predetermined voltage level, such as in the event of a sudden power-off of a main power supply, the first unidirectional device 111B may obstruct the current path from the first power supply line PL1 to the second power supply line PL2. In some embodiments, the first unidirectional device 111B may be implemented as a diode or an MOSFET.

The second unidirectional device 112B is connected between the buck converter 117B and the second power supply line PL2. As an example, the second unidirectional device 112B may form a current path based on a difference between an output voltage level of the buck converter 117B and a voltage level of the second power supply line PL2. In other words, if an output voltage level of the buck converter 117B is higher than a voltage level of the second power supply line PL2 by at least a threshold voltage level, a current path may be formed from the buck converter 117B to the second power supply line PL2. However, if an output voltage level of the buck converter 117B is not higher than a voltage level of the second power supply line PL2 by at least a threshold voltage level, a current path may be obstructed.

As another example, the second unidirectional device 112B may form a current path based on a voltage level of the second power supply line PL2. In other words, if a voltage level of the second power supply line PL2 is lower than a predetermined voltage level, a current path may be formed. However, if a voltage level of the second power supply line PL2 is equal to or higher than the predetermined voltage, a current path may be obstructed.

If a voltage level of the main power supply decreases to a level that is equal to or less than a predetermined voltage level, for example in the event of a sudden power-off of a main power supply, the second unidirectional device 112B may form a current path based on a charging voltage level of the charging circuit 114A. In some embodiments, the second unidirectional device 112A may be implemented as a diode or an MOSFET.

The current limiter 113B is connected between the boost converter 116B and the second power supply line PL2. The current limiter 113B may protect the charging circuit 114B. For example, the current limiter 113B may reduce or prevent overcurrent from flowing into the charging circuit 114B. The current limiter 113B may supply a current having a level that is equal to or less than a level of predetermined maximum current to the charging circuit 114B via the boost converter 116B, during a time interval in which a charging enable signal EN_CH is being transmitted to the auxiliary power supply unit 110. Additionally, the current limiter 113B may disable a supply of current to the charging circuit 114B via the boost converter 116B during a time interval in which a charging disable signal DIS_CH is being transmitted to the auxiliary power supply unit 110.

The boost converter 116B is connected between the current limiter 113B and the charging circuit 114B. The boost converter 116B increases a level of an output voltage of the current limiter 113B, and outputs current with the increased level of the output voltage to the charging circuit 114B. Due to the presence of the boost converter 116B, a capacity of electric energy charged by the current circuit 114B may be increased.

The buck converter 117B is connected between the charging circuit 114B and the second unidirectional device 112B. The buck converter 117B decreases a level of an output voltage of the current limiter 114B, and outputs current with the decreased level of the output voltage to the second unidirectional device 112B. In some embodiments, a rate at which the boost converter 116B increases a level of an output voltage may be equal to a rate at which the buck converter 117B decreases a level of an output voltage. In other embodiments, a rate at which the boost converter 116B increases a level of an output voltage may be different from a rate at which the buck converter 117B decreases a level of an output voltage, in consideration of a difference between a voltage level of the main power supply and a voltage level of the auxiliary power supply.

The charging circuit 114B stores electric energy using current supplied by the main power supply which is input via the first unidirectional device 111B, the current limiter 113B, and the boost converter 115B. In some embodiments, the energy storage device 114B may include one or more capacitors.

The voltage detector 115B is connected to the charging circuit 114B. If, during an auxiliary power supply test mode, a charging voltage at a node A Nd_A of the charging circuit 114B is detected as being less than a predetermined threshold voltage, the voltage detector 115B generates an auxiliary power interrupt signal INT_VD. In other words, the voltage detector 115B detects a charging voltage of the node A Nd_A and, if the detected charging voltage is less than a predetermined threshold voltage, the voltage detector 115B generates an auxiliary power interrupt signal INT_VD.

In the embodiments illustrated in FIG. 3, the boost converter 116B is connected between the current limiter 113B and the charging circuit 114B. In other embodiments, the boost converter 116B may be connected between the first unidirectional device 111B and the current limiter 113B.

Additionally, in the embodiments illustrated in FIG. 3, the buck converter 117B is connected between the charging circuit 114B and the second unidirectional device 112B. In other embodiments, the buck converter 117B may be connected between the second unidirectional device 112B and the second power supply line PL2.

Figure 4A:
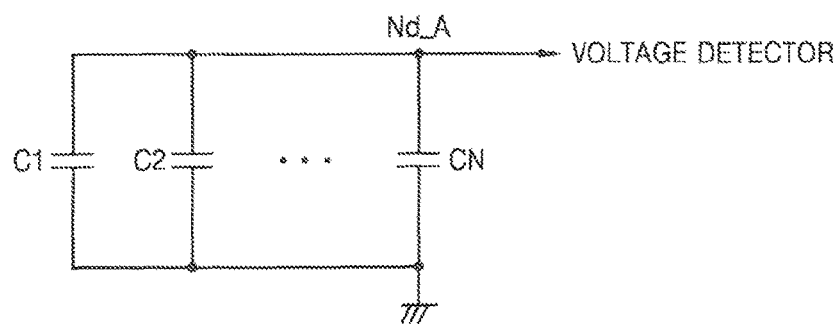
FIG. 4A illustrates an example of a charging circuit shown in FIG. 2 or 3.

FIG. 4A illustrates an example of the charging circuit 114A or 114B shown in FIG. 2 or 3.

Referring to FIG. 4A, in the charging circuit 114A or 114B, a plurality of capacitors C1 through CN are connected in parallel between the node A Nd_A and a ground terminal. FIG. 4 shows an example in which 3 or more capacitors are connected between the node A Nd_A and a ground terminal. However, 2 capacitors may be connected between the node A Nd_A and a ground terminal. In other words, a single capacitor or two capacitors may constitute the charging circuit 114A or 114B. The plurality of capacitors C1 through CN constituting the charging circuit 114A or 114B operate as backup capacitors.

The capacitance $Ceq_{,A}$ of the charging circuit 114A or 114B illustrated in FIG. 4A is equal to the sum of the capacitances of the parallel capacitors C1 to CN as follows:

$$Ceq_{,A} = C1 + C2 + \ldots + CN \qquad [1]$$

Figure 4B:
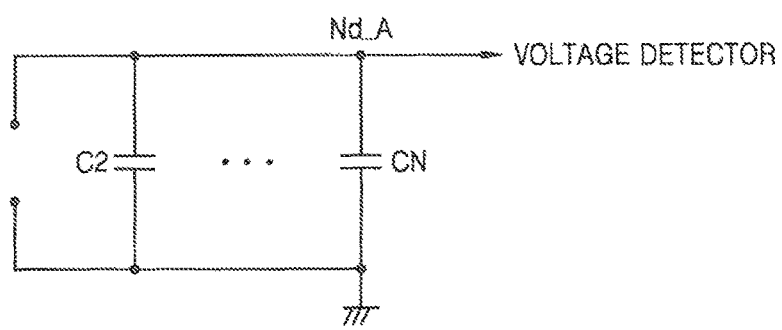
FIG. 4B illustrates an example of a charging circuit shown in FIG. 2 or 3 in which one of the capacitors has experienced an open fault.

FIG. 4B illustrates an example of the charging circuit 114A or 114B shown in FIG. 2 or 3 in which one of the capacitors, C1, has suffered an open fault. In that case, the capacitor C1 appears as an open circuit. The capacitance $Ceq_{,B}$ of the charging circuit 114A or 114B then becomes:

$$Ceq_{,B} = C2 + \ldots + CN \qquad [2]$$

As is apparent from Equations [1] and [2], $Ceq_{,B}$ is less than $Ceq_{,A}$. Thus, a charging circuit that includes a capacitor that has suffered an open fault may have a reduced capacitance. A charging circuit that includes a capacitor that has suffered an open fault may therefore be capable of storing less charge, and energy stored therein may discharge more quickly.

Figure 5:
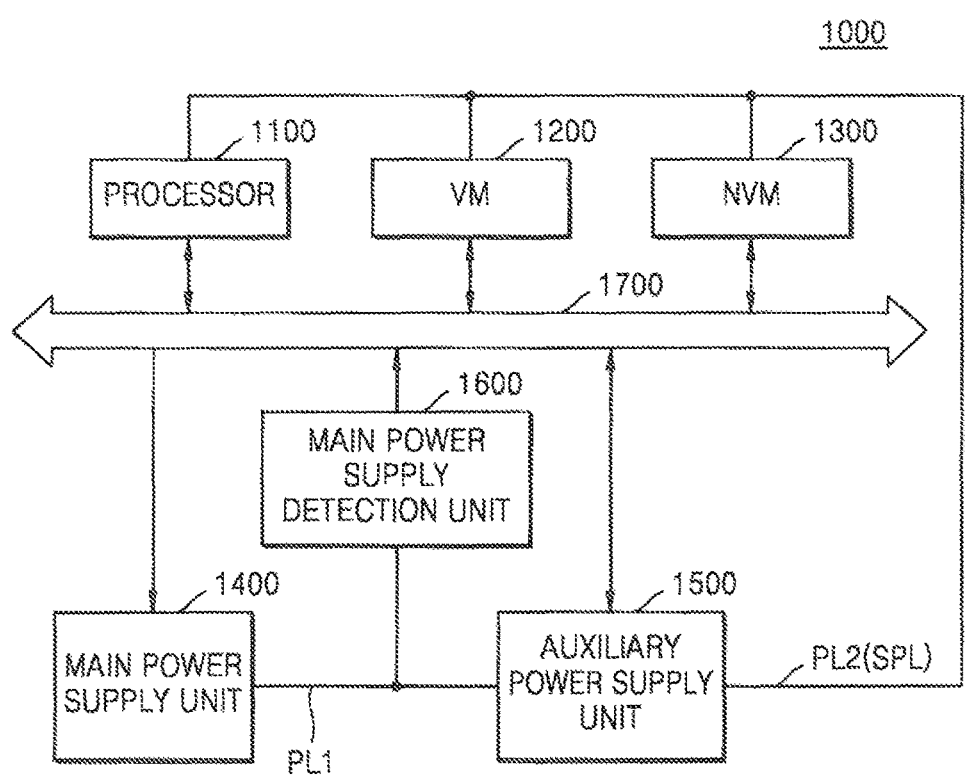
FIG. 5 illustrates a block diagram of an example of an electronic apparatus to which the auxiliary power test apparatus shown in FIG. 1 is applied.

FIG. 5 illustrates a block diagram of an example of an electronic apparatus 1000 in which the auxiliary power test apparatus 100 shown in FIG. 1 may be employed.

Referring to FIG. 5, the electronic apparatus 1000 includes a processor 1100, a volatile memory (VM) 1200, a non-volatile memory (NVM) 1300, a main power supply unit 1400, an auxiliary power supply unit 1500, a main power supply detection unit 1600, and a bus 1700.

The electronic apparatus 1000 may be a personal computer, a set-top box, a personal digital assistant (PDA), a mobile apparatus, a camera, or the like.

The bus 1700 refers to a transmission path for transmitting data, commands, addresses, or control signals between elements of the electronic apparatus 1000.

The VM 1200 may include static random access memory (SRAM) or dynamic random access memory (DRAM) storing data, commands, or program codes which are needed to operate the electronic apparatus 1000. As an example, the VM 1200 may store data processed by the processor 1100, data to be written to the NVM 1300, data read from the NVM 1300, or the like. The VM may store program codes for performing data backup in a case of a sudden power-off. Additionally, the VM 1200 may store program codes for performing an auxiliary power supply test method, which is to be described with reference to a flowchart shown in FIG. 6 or 7.

Data stored in the NVM 1300 may be preserved even when power is shut down. As an example, the NVM 1300 may be implemented as flash memory, phase change RAM (PRAM), ferroelectric RAM (FRAM), magnetic RAM (MRAM), or the like.

The main power supply unit 1400 supplies main power needed to operate the elements of the electronic apparatus 1000.

The auxiliary power supply unit 1500 stores electric energy in an energy storage device while the main power is being supplied to the auxiliary power supply unit 1500. Additionally, the auxiliary power supply unit 1500 enables the main power to be output to a system power supply line SPL, and disables auxiliary power from being output to the system power supply line SPL.

The auxiliary power supply unit 110A or 110B, shown in FIG. 2 or 3, may be used as the auxiliary power supply unit 1500.

The main power detection unit 1600 detects a decrease in a voltage level of the main supply voltage to a level that is less than a threshold voltage level. Thus, the main power supply detection unit 1600 may detect an occurrence of a sudden power-off state, in which supply of the main power is abnormally disabled when a sudden power-off command is not executed by the processor 1100.

The processor 1100 may include a circuit, interfaces, or program codes for processing data and controlling operations of elements of the electronic apparatus 1000. As an example, the processor 1100 may include a central processing unit (CPU), advanced reduced instructions set computing machine (ARM), or an application specific integrated circuit (ASIC). The processor 1100 may control the electronic apparatus 1000 to back up data stored in the VM 1200 to the NVM 1300 by using auxiliary power in a case of sudden-power off of the electronic apparatus 1000. As an example, the processor 1100 may back up metadata or cache data, stored in the VM 1200, to the NVM 1300 by using auxiliary power in a case of sudden-power off of the electronic apparatus 1000.

The processor 1100 may cause the electronic apparatus 1000 to perform operations, included in the auxiliary power supply test method described with reference to FIG. 6 or 7, by using the program codes stored in the VM 1200.

In a general operation mode, the processor 1100 transmits a charging enable signal EN_CH to the auxiliary power supply unit 1500 via the bus 1700, and in an auxiliary power supply test mode, the processor transmits a charging disable signal DIS_CH to the auxiliary power supply unit 1500 via the bus 1700. As an example, a charging enable signal EN_CH and a charging disable signal DIS_CH may be transmitted to the auxiliary power supply unit 1500 via an enable signal line SL_EN included in the bus 1700. In particular, if a signal applied to the enable signal line SL_EN has a first logical state, it may be determined that the charging enable signal EN_CH is applied to the auxiliary power supply unit 1500. Additionally, if a signal applied to the enable signal line SL_EN has a second logical state, it may be determined that the charging disable signal DIS_CH is applied to the auxiliary power supply unit 1500. As an example, if the first logical state is logical "HIGH", the second logical state may be logical "LOW". Conversely, if the first logical state is logical "LOW", the second logical state may be logical "HIGH".

If the main power is normally supplied to the first power supply line PL1, the processor 1100 receives the main power via the second power supply line PL2. If the power supply to the first power supply line PL is interrupted, the processor 120 receives auxiliary power from the auxiliary power supply unit 1500 via the second power line PL2.

The processor 1100 may determine a time interval in which a charging disable signal DIS_CH is generated in an auxiliary power test mode as a length of a time interval in which a level of a charging voltage generated by the auxiliary power supply unit 1500 is maintained to be higher than a level of a threshold voltage that may be sufficient to operate as an auxiliary power supply.

As an example, if main power is supplied to the first power supply line PL1 while an auxiliary power supply test mode is executed, the auxiliary power supply unit 1500 enables the main power to be output on the second power supply line PL2, and disables auxiliary power energy storage device from being output on the second power line PL2. Accordingly, natural discharging occurs in the energy storage device included in the auxiliary power supply unit 1500 in a time interval in which a charging disable signal DIS_CH is applied to the auxiliary power supply unit 1500 in the auxiliary power supply test mode. As an example, the energy storage device may include one or more capacitors.

In the auxiliary power test mode, the auxiliary power supply unit 1500 monitors a charging voltage based on electric energy stored in the energy storage device. If, during the auxiliary test mode, the charging voltage is detected to be less than a predetermined threshold voltage (Vth), the auxiliary power supply unit 1500 generates an auxiliary power interrupt signal INT_VD, and transmits the generated auxiliary power interrupt signal INT_VD to the processor 1100 via the bus 1700. As an example, if a number of capacitors in which an open fault occurs, from among the plurality of capacitors C1 through CN included in the charging circuit 114A or 114B shown in FIG. 4, is increased, natural discharging of energy from the energy storage device may occur more quickly. Accordingly, if one or more of the capacitors C1 through CN included in the charging circuit 114A or 114B shown in FIG. 4, suffers an open faut, an auxiliary power supply interrupt signal INT_VD may be generated.

When the processor 1100 receives the auxiliary power interrupt signal INT_VD, the processor 1500 generates a backup fail signal BUP_FA indicating that the auxiliary power supply unit 1500 is defective. In particular, the backup fail signal BUP_FA indicates that an open fault has occurred in the energy storage device included in the auxiliary power supply unit 1500. This indicates that an open fault has occurred in the backup capacitor included in the charging circuit 114A or 114B.

If the auxiliary power supply unit 1500 is determined to be defective, the processor 1500 may continuously transmit a charging disable signal DIS_CH to the auxiliary power supply unit 1500 via the bus 1700. If the charging disable signal DIS_CH is continuously transmitted to the auxiliary power supply unit 1500, a charging operation by the auxiliary power supply unit 1500 is disabled.

Figure 6:
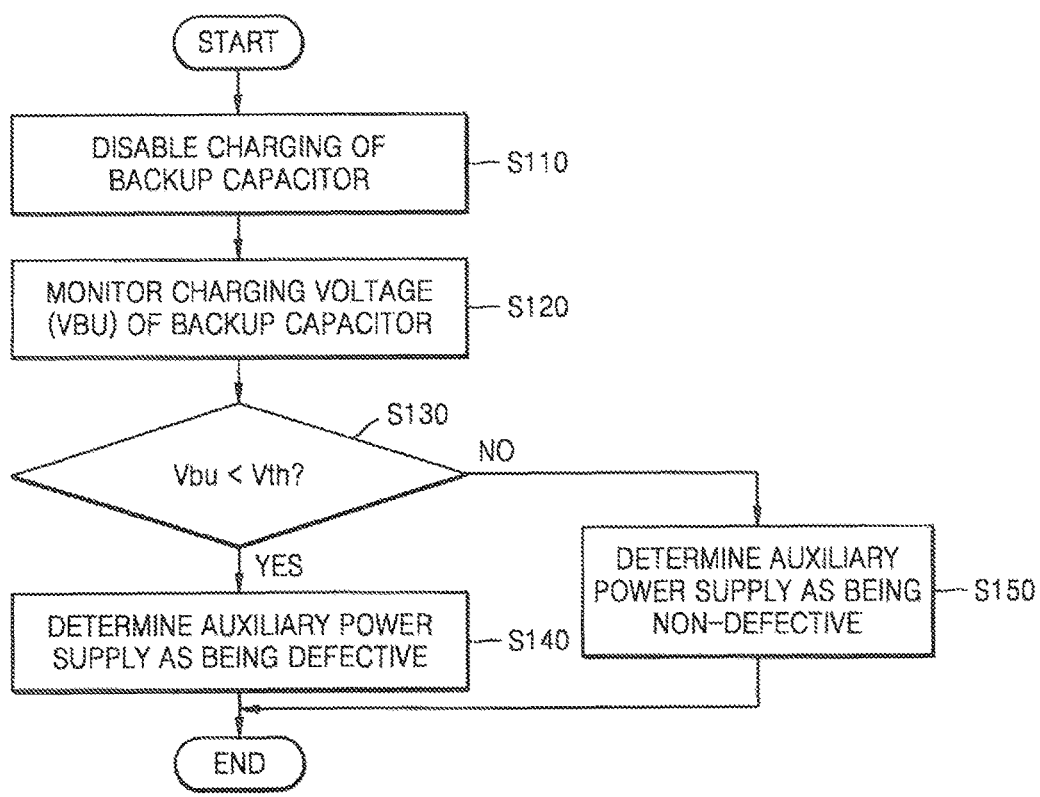
FIG. 6 is a flowchart of an example of an auxiliary power test method according to an exemplary embodiment.

FIG. 6 is a flowchart of an example of an auxiliary power test method according to an exemplary embodiment.

As an example, FIG. 6 is a flowchart of an auxiliary power test method that may be performed by various types of an electronic apparatus that includes the auxiliary power supply test apparatus 100 shown in FIG. 1. In particular, the auxiliary power supply test method is described with reference to the electronic apparatus 1000 shown in FIG. 5.

In operation S110, the processor 1100 disables charging of a backup capacitor by the auxiliary power supply unit 1500. As an example, the processor 1100 may transmit a charging disable signal DIS_CH to the auxiliary power supply unit 1500. Accordingly, current for charging may not be supplied to the backup capacitor in a time interval in which the charging disable signal DIS_CH to the auxiliary power supply unit 1500. As an example, the backup capacitor may include the plurality of capacitors C1 through CN included in the charging circuit 114A or 114B in the auxiliary power supply unit 1500 shown in FIG. 4. As an example, a length of a time interval in which a level of a charging voltage, generated according to normal natural discharging in a charging circuit included in the auxiliary power supply unit 1500, may be maintained to be higher than a level of a proof voltage that may operate as auxiliary power may be determined as a length of a time interval in which a charging disable signal DIS_CH is generated in an auxiliary power test mode. In some embodiments, the length of time for which the charging disable signal DIS_CH is generated may be less than the length of time for which a level of a charging voltage is to be maintained to be higher than a level of the proof voltage.

As a reference, since main power is supplied to the auxiliary power supply unit 1500 in a time interval in which the charging disable signal DIS_CH is applied to the auxiliary power supply unit 1500, natural discharging occurs in the backup capacitor in the charging circuit 114A or 114B. In other words, referring to FIG. 2 or 3, current charged in the backup capacitor in the charging circuit 114A or 114B is obstructed by the second unidirectional device 112A or 112B.

Then, in operation S120, the auxiliary power supply unit 1500 monitors a charging voltage Vbu of the backup capacitor. In particular, the auxiliary power supply unit 1500 monitors a charging voltage Vbu, detected from the node A Nd_A shown in FIG. 4, in a time interval in which the charging disable signal DIS_CH is applied to the auxiliary power supply unit 1500 in the auxiliary power supply test mode.

Then, in operation S130, it is determined whether the charging voltage Vbu of the backup capacitor is less than a predetermined threshold voltage Vth, as a result of the monitoring of the charging voltage Vbu in the section where the charging disable signal DIS_CH is applied to the auxiliary power supply unit 1500 in the auxiliary power supply test mode. For example, if the charging voltage Vbu of the backup capacitor is less than a predetermined threshold voltage Vth, the auxiliary power supply unit 1500 may transmit an auxiliary power interrupt signal INT_VD to the processor 1100.

If the charging voltage Vbu falls to less than the initially determined threshold voltage Vth, the processor 1100 may determine that the auxiliary power supply is defective in operation S140. As an example, if the processor 1100 receives an auxiliary power supply interrupt signal INT_VD from the auxiliary power supply unit 1500 in the auxiliary power supply test mode, the processor 1100 determines that the auxiliary power supply is defective. In particular, the processor 1100 may determine that an open fault has occurred in the backup capacitor constituting the charging circuit 114A or 114B included in the auxiliary power supply unit 1500.

If the charging voltage Vbu has not dropped to less than the predetermined threshold voltage Vth, the processor 1100 determines the auxiliary power supply as being non-defective in operation S140. In other words, the processor 1100 may determine that an open fault has not occurred in the backup capacitor constituting the charging circuit 114A or 114B included in the auxiliary power supply unit 1500.

As an example, the auxiliary power supply test method described with reference to the flowchart shown in FIG. 6 may be performed in a test process before a product is shipped. As another example, the auxiliary power supply test method described with reference to the flowchart shown in FIG. 6 may be performed in a user environment after a product is shipped.

Figure 7A:
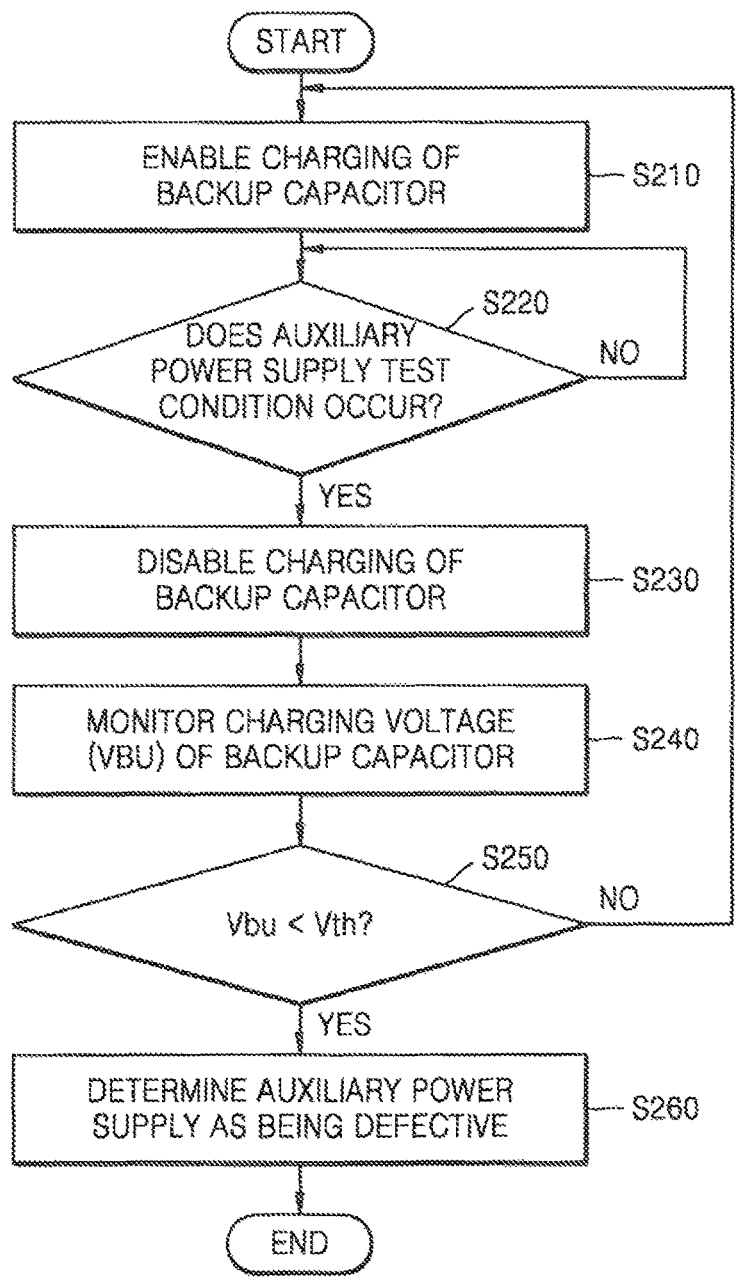
FIGS. 7A and 7B are flowcharts of further examples of auxiliary power test methods according to exemplary embodiments.

FIG. 7A is a flowchart of an auxiliary power test method that may be performed by various types of electronic apparatus that includes the auxiliary power supply test apparatus 100 shown in FIG. 1. In particular, the auxiliary power supply test method is described with reference to the electronic apparatus shown in FIG. 5.

In operation S210, the processor 1100 charges a backup capacitor included in the auxiliary power supply unit 1500. As an example, the processor 1100 applies a charging enable signal EN_CH to the auxiliary power supply unit 1500. Accordingly, current for charging is supplied to the backup capacitor in a time interval in which the charging enable signal EN_CH to the auxiliary power supply unit 1500. In other words, if current for charging is supplied to the backup capacitor in the auxiliary power supply unit 1500 for a certain period of time or more, the backup capacitor reaches a fully charged state when the backup capacitor is charged to obtain a maximum allowable voltage.

Then, in operation S220, the processor 1100 determines whether an auxiliary power supply test condition has occurred. Since an open fault in the energy storage device included in the auxiliary power supply unit 1500 may occur as a potential progressive fault, the processor 120 may repeatedly execute an auxiliary power supply test. As an example, if an predetermined period of time elapses from a time point when a previous auxiliary power supply test was performed, it may be determined that an auxiliary power supply test condition has occurred. In particular, the auxiliary power supply test condition may occur when a predetermined period of time elapses from a time point when a previous auxiliary power supply test is performed and the backup capacitor reaches a fully charged state.

As a result of the determining in operation S220, if the auxiliary power supply test condition has occurred, the processor 1100 disables operation of charging the backup capacitor included in the auxiliary power supply unit 1500. As an example, the processor 1100 applies a charging disable signal DIS_CH to the auxiliary power supply unit 1500. Accordingly, current for charging is not supplied to the backup capacitor in a time interval in which the charging disable signal DIS_CH is applied to the auxiliary power supply unit 1500. As an example, a length of a time interval in which a level of a charging voltage, generated according to normal natural discharging in a charging circuit included in the auxiliary power supply unit 1500, may be maintained to be higher than a level of a proof voltage that may operate as auxiliary power may be determined as a length of a time interval in which a charging disable signal DIS_CH is generated in an auxiliary power test mode.

Then, in operation S240, the auxiliary power supply unit 1500 monitors a charging voltage Vbu of the backup capacitor. In particular, the auxiliary power supply unit 1500 monitors a charging voltage Vbu, detected from the node A Nd_A shown in FIG. 4, in a time interval in which the charging disable signal DIS_CH is applied to the auxiliary power supply unit 1500 in the auxiliary power supply test mode.

Then, in operation S250, it is determined whether the charging voltage Vbu of the back capacitor is less than a predetermined threshold voltage Vth, as a result of monitoring the charging voltage Vbu in the section where the charging disable signal DIS_CH is applied to the auxiliary power supply unit 1500 in the auxiliary power supply test mode. For example, if the charging voltage Vbu of the backup capacitor is less than the predetermined threshold voltage Vth, the auxiliary power supply unit 110 transmits an auxiliary power interrupt signal INT_VD to the processor 1100.

If it is found in operation S250 that the charging voltage Vbu has dropped to less than the predetermined threshold voltage Vth, the processor 1100 may determine that the auxiliary power supply is defective in operation S260. As an example, if the processor 1100 receives an auxiliary power supply interrupt signal INT_VD from the auxiliary power supply unit 1500 in the auxiliary power supply test mode, the processor 1100 determines that the auxiliary power supply is defective. In particular, the processor 1100 may determine that an open fault has occurred in the backup capacitor constituting the charging circuit 114A or 114B included in the auxiliary power supply unit 1500.

If it is found operation S250 that the charging voltage Vbu has not dropped to less than the predetermined threshold voltage Vth, the processor 1100 returns to operation S210, and re-enables the charging of the backup capacitor.

As such, if the auxiliary power supply is not determined as being defective in an auxiliary power supply test mode, the auxiliary power supply test mode is re-executed after a certain period of time elapses, so that an open fault in the back capacitor which may occur as a potential progressive fault may be effectively detected.

Figure 7B:
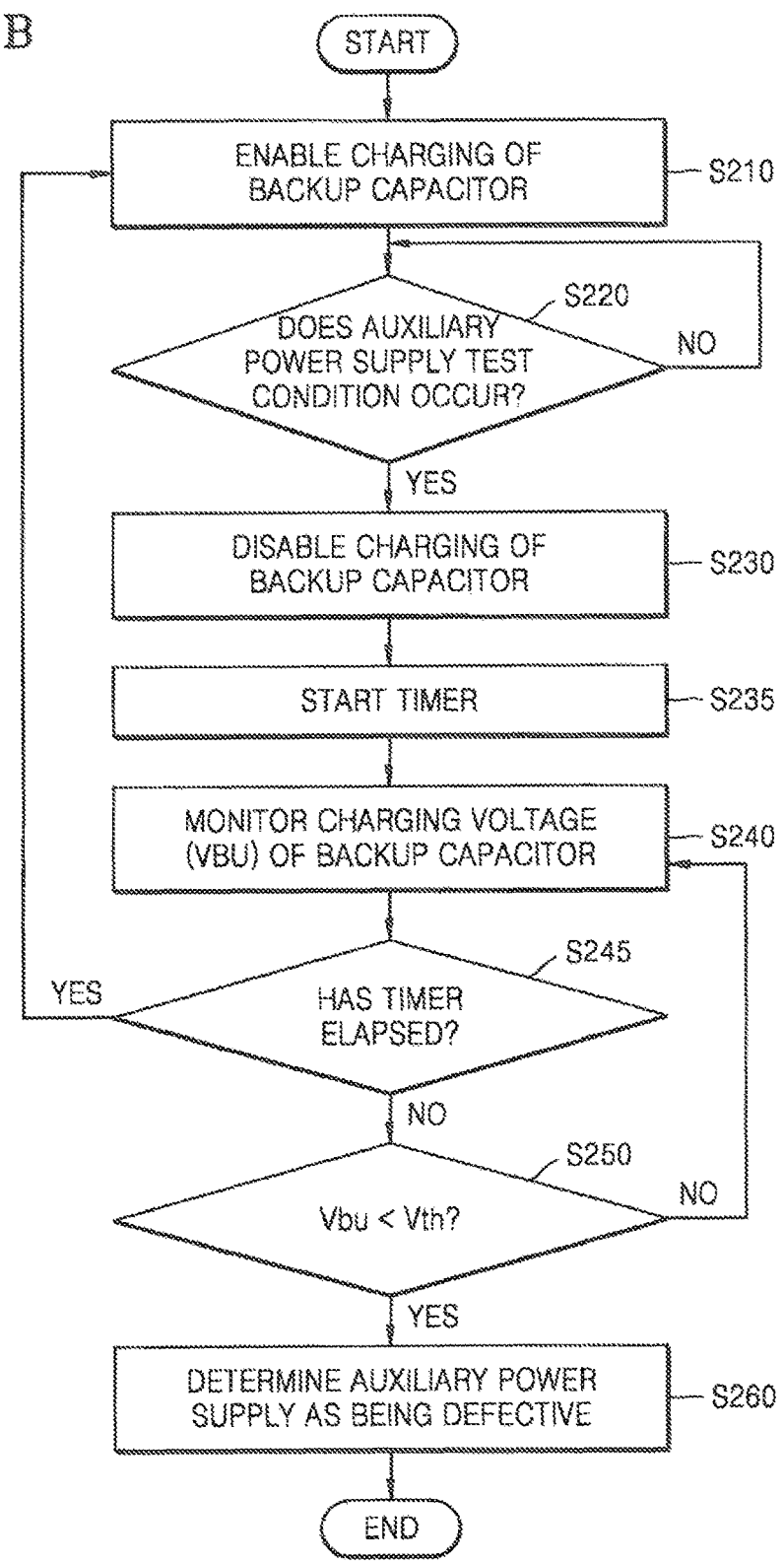

FIG. 7B is a flowchart of another example of an auxiliary power supply test method according to further embodiments. The flowchart of FIG. 7B includes elements similar to the flowchart of FIG. 7A, and a repetitive description of such elements will be omitted.

In the flowchart of FIG. 7B, after charging of the backup capacitor is disabled in operation 230, the processor 1100 starts a timer in operation S235. The timer indicates how long the auxiliary power supply test mode has lasted. In some embodiments, the processor 1100 may start the timer before the charging of the backup capacitor is disabled in operation 230. The processor 1100 also establishes a predetermined time limit $T_{test}$ that determines how long the auxiliary power supply test mode will be performed.

After the processor 1100 has started monitoring the charging voltage Vbu of the backup capacitor in operation S240, the processor checks in operation 245 to see if the timer has elapsed, that is, if the value T is greater than the time limit $T_{test}$. If not, then the processor 1100 proceeds to determine at operation S250 if the charging voltage Vbu has dropped to less than the predetermined threshold voltage Vth. If the timer value T is greater than the time limit $T_{test}$, the auxiliary power supply test mode is ended, and operations return to block S210.

Further, in the flowchart of FIG. 7B, if it is determined at operation S250 that the charging voltage Vbu has not dropped to less than the predetermined threshold voltage Vth, operations return to operation S240 where the processor 1100 continues to monitor the charging voltage VBU of the backup capacitor.

Figure 8:
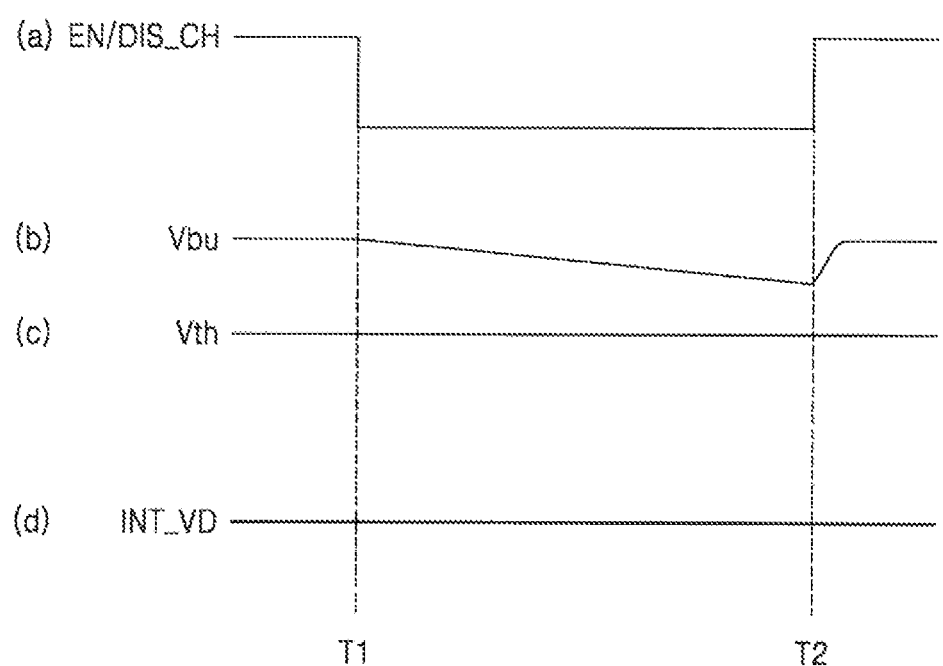
FIG. 8 is a graph showing waveforms of main signals obtained when an auxiliary power supply unit included in an auxiliary power test apparatus is non-defective, according to an exemplary embodiment.

FIG. 8 is a graph are graphs showing example waveforms of various signals generated when the auxiliary power supply unit 110 included in the auxiliary power test apparatus 100 is non-defective, according to an exemplary embodiment.

Referring to FIG. 8, an auxiliary power supply test mode is executed in an interval between times T1 and T2. In other words, a charging disable signal DIS_CH is applied to the auxiliary power supply unit 110 in the time interval from time T1 to time T2. The time interval between time T1 and time T2 may correspond to the time limit $T_{test}$ described above. Additionally, the charging enable signal EN_CH is applied to the auxiliary power supply unit 110 in a time interval before T1 and a time interval after T2 which correspond to a general operation mode.

As an example, as shown in FIG. 8(a), a logical "HIGH" state of a charging enable/disable signal ENH/DIS_CH indicates a charging enable signal EN_CH, and a logical "LOW" state of a charging enable/disable signal ENH/DIS_CH indicates a charging disable signal DIS_CH.

If an open fault is not present in the backup capacitor included in the auxiliary power supply unit 110, natural discharge of a charging voltage Vbu of the backup capacitor occurs from a fully charged state with a low slope as shown in FIG. 8(b). Accordingly, as shown in FIGS. 8(b) and 8(c), a level of the charging voltage Vbu in the section between T1 and T2 is maintained at a level higher than a level of a predetermined threshold voltage Vth.

Accordingly, as shown in FIG. 8(d), a pulse of the auxiliary power supply interrupt signal INT_VD is not generated in the time interval between time T1 and time T2. In other words, the interrupt signal INT_VD is maintained at a same logical state between the section before T1 and the section after T2 which correspond to the general operation mode, and the time interval between time T1 and time T2. Accordingly, the processor 120 determines that the auxiliary power interrupt signal INT_VD has not been generated.

Figure 9:
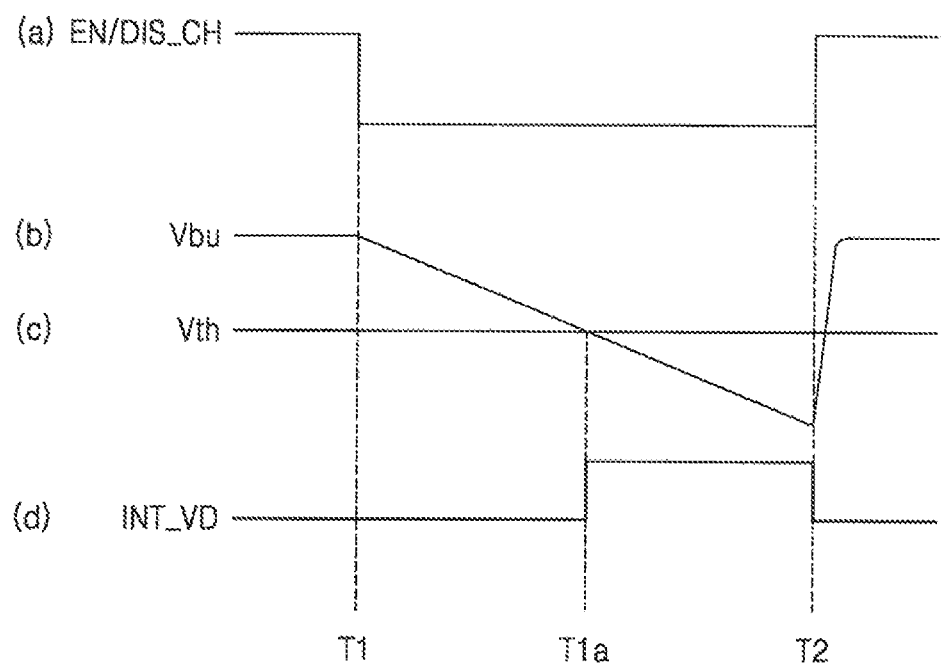
FIG. 9 is a graph showing waveforms of main signals obtained when an auxiliary power supply unit included in an auxiliary power test apparatus is defective, according to an exemplary embodiment.

FIG. 9 is a graph showing example waveforms of signals generated when the auxiliary power supply unit 110 included in the auxiliary power test apparatus 100 is defective, according to an exemplary embodiment;

Referring to FIGS. 9(a) through 9(d), an auxiliary power supply test mode is executed is in a time interval between time T1 and time T2. In other words, a charging disable signal DIS_CH is applied to the auxiliary power supply unit 110 in the time interval between T1 and T2. Additionally, the charging enable signal EN_CH is applied to the auxiliary power supply unit 110 in a time interval before time T1 and a time interval after T2 which correspond to a general operation mode.

As an example, as shown in FIG. 9(a), a logical "HIGH" state of a charging enable/disable signal ENH/DIS_CH indicates a charging enable signal EN_CH, and a logical "LOW" state of a charging enable/disable signal ENH/DIS_CH indicates a charging disable signal DIS_CH.

If an open fault is present in the backup capacitor included in the auxiliary power supply unit 110, fast natural discharge of a charging voltage Vbu of the backup capacitor occurs from a fully charged state with a high slope as shown in FIG. 9(b). Accordingly, as shown in FIGS. 9(b) and 9(c), a level of the charging voltage Vbu in the time interval between time T1 and time T2 is dropped to a level lower than a level of a predetermined threshold voltage Vth.

Accordingly, as shown in FIG. 9(d), an auxiliary power supply interrupt signal INT_VD in the form of a pulse is generated in a time interval in which the charging voltage Vbu is lower than the predetermined threshold voltage Vth from among the time interval between time T1 and time T2.

Accordingly, the processor 120 determines that the auxiliary power interrupt signal INT_VD has been generated.

Figure 10:
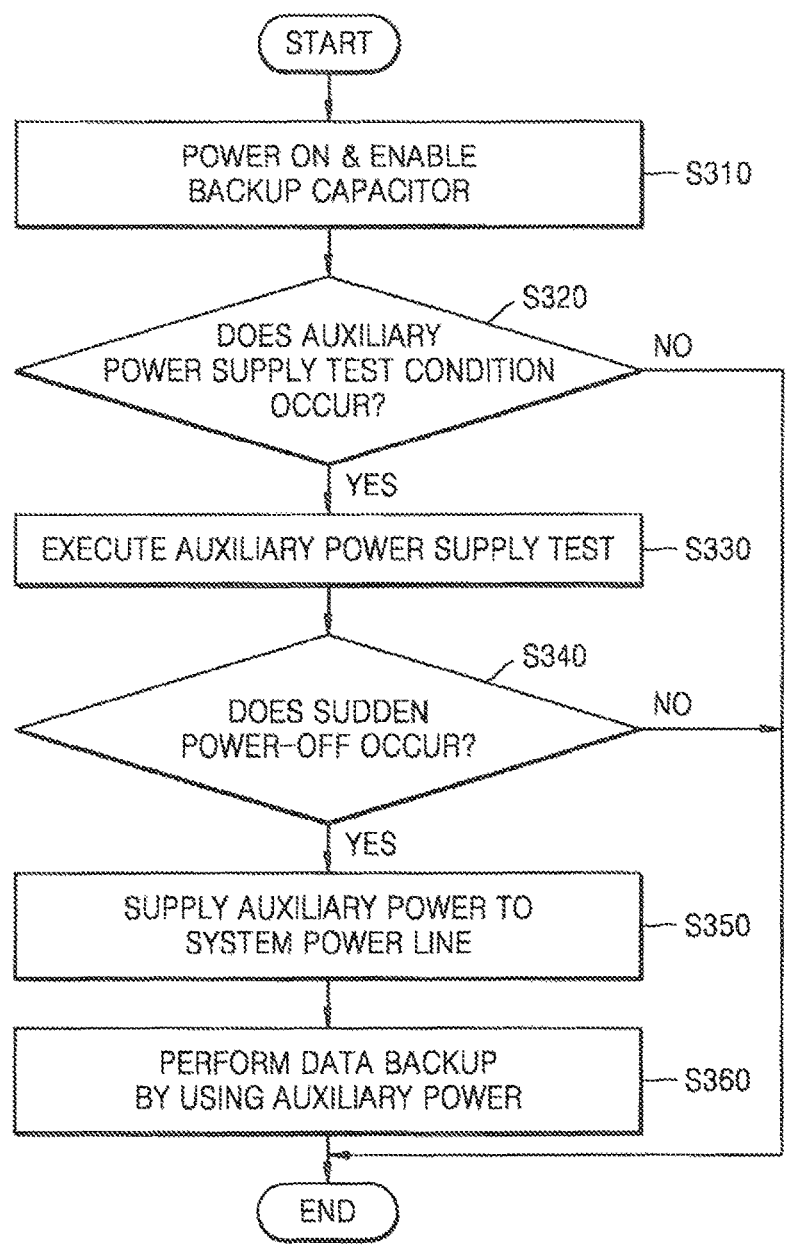
FIG. 10 is a flowchart of a process of controlling an electronic apparatus in a case of a sudden power-off of the electronic apparatus while testing an auxiliary power supply in the electronic apparatus.

FIG. 10 is a flowchart of a method of controlling an electronic apparatus in a case of a sudden power-off of the electronic apparatus during a process of testing an auxiliary power supply in the electronic apparatus.

As an example, FIG. 10 is a flowchart of a method, in a process of testing an auxiliary power supply which may be performed by various types of an electronic apparatus that includes the auxiliary power supply test apparatus 100 shown in FIG. 1, of controlling the electronic apparatus in a case of a sudden power-off of the electronic apparatus. In particular, a method of controlling the electronic apparatus 1000, shown in FIG. 5, in a case of a sudden power-off of the electronic apparatus 1000 is described.

In operation S310, if power of the electronic apparatus 1000 is turned on, the processor 1100 charges a backup capacitor included in the auxiliary power supply unit 1500. As an example, the processor 1100 applies a charging enable signal EN_CH to the auxiliary power supply unit 1500. Accordingly, current for charging is supplied to the backup capacitor in a time interval in which the charging enable signal EN_CH is applied to the auxiliary power supply unit 1500. In other words, if current for charging is supplied to the backup capacitor in the auxiliary power supply unit 1500 for a certain period of time or more, the backup capacitor reaches a fully charged state in which the backup capacitor is charged to obtain a maximum allowable voltage.

Then, in operation S320, the processor 1100 determines whether an auxiliary power supply test condition has occurred. Since an open fault in the energy storage device included in the auxiliary power supply unit 1500 may occur as a potential progressive fault, the processor 1100 may repeatedly execute an auxiliary power supply test. As an example, if a predetermined period of time elapses from a time point when a previous auxiliary power supply test was executed, it may be determined that the auxiliary power supply test condition has occurred. In particular, an auxiliary power supply test condition may occur when a predetermined period of time elapses from a time point when a previous auxiliary power supply test was executed and the backup capacitor reaches a fully charged state.

As a result of the determining in operation S320, if the auxiliary power supply test condition has occurred, the processor 1100 performs an auxiliary power supply test in operation S330. As an example, the auxiliary power supply test may be performed as described with reference to the flowchart shown in FIG. 6 or 7.

In operation S340, the processor 1100 determines whether a sudden power-off occurs while the auxiliary power supply test is being performed. As an example, a sudden power-off may be detected if a voltage level of a main power supply is less than a minimum operation allowed voltage level when a power-off command is not executed.

If it is determined that a sudden power-off has occurred during of the auxiliary power supply test, auxiliary power charged in the auxiliary power supply unit 1500 is supplied to a system power supply line. In other words, if a sudden power-off occurs in the section of the auxiliary power supply test, the auxiliary power supply unit 1500 supplies the auxiliary power, charged in a backup capacitor of a charging circuit, to a system power supply line. This is because, if an open fault does not occur in a backup capacitor constituting a charging circuit, a level of a charging voltage, which is generated according to natural discharge of a backup capacitor, is maintained to be higher than a level of a proof voltage that may operate as auxiliary power in the section of the auxiliary power supply test.

Then, in operation S360, the processor 1100 backs up data by using the auxiliary power supplied to the system power supply line. As an example, the processor 1100 may back up metadata or cache data stored in the VM 1200 by using auxiliary power, in a case of a sudden power-off of the electronic apparatus 1000.

Figure 11:
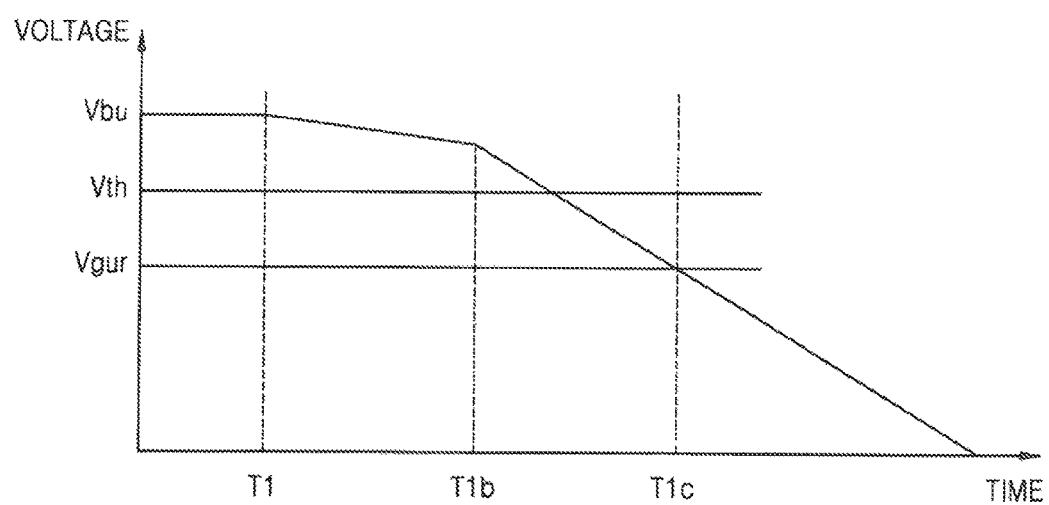
FIG. 11 is a graph showing a change in a charging voltage of an auxiliary power supply unit in a case of a sudden power-off of an electronic apparatus in a process of testing an auxiliary power supply in the electronic apparatus, according to an exemplary embodiment.

FIG. 11 is a graph showing a change in a charging voltage of an auxiliary power supply apparatus in a case of a sudden power-off of an electronic apparatus during a process of testing the auxiliary power supply, according to an exemplary embodiment.

Referring to FIG. 11, the auxiliary power supply test mode is executed from a time point T1, and a sudden power-off occurs at a time point T1b. In other words, FIG. 11 shows a state when a sudden power-off has occurred while an auxiliary power supply test mode is executed.

As a reference, if an open fault is not present in the backup capacitor included in the auxiliary power supply unit 110, natural discharge of a charging voltage Vbu of the backup capacitor occurs from a fully charged state with a low slope.

If an open fault is not present in the backup capacitor included in the auxiliary power supply unit 110, a level of the charging voltage Vbu is maintained at a level higher than a level of a predetermined threshold voltage Vth in a time interval in which an auxiliary power supply test mode is executed. Additionally, it may be understood that the threshold voltage Vth used to determine an open fault in the backup capacitor is set to be higher than a proof voltage that may operate as an auxiliary power supply to a system.

Accordingly, if a sudden power-off occurs at a time point T1b while the auxiliary power supply test mode is executed, a charging voltage Vbu of the backup capacitor functions as an auxiliary power supply in a time interval in which the threshold voltage Vth is equal to or higher than the proof voltage Vgur. In other words, the charging voltage Vbu of the backup capacitor in the section from T1b to T1c may function as an auxiliary power supply. Accordingly, data backup may be performed in the section from T1b to T1c.

Figure 12:
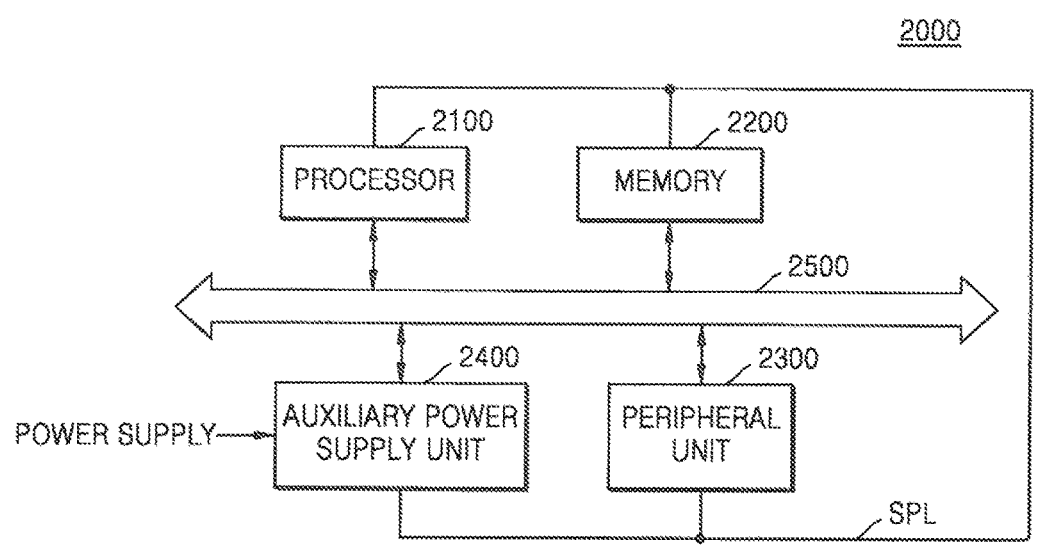
FIG. 12 illustrates a block diagram of another example of an electronic apparatus to which the auxiliary power test apparatus is applied, according to an exemplary embodiment.

FIG. 12 illustrates a block diagram of another example of an electronic apparatus 2000 to which an auxiliary power test apparatus is applied, according to an exemplary embodiment.

Referring to FIG. 12, the electronic apparatus 2000 includes a processor 2100, a memory 2200, a peripheral unit 2300, an auxiliary power supply unit 2400, and a bus 2500.

Although not shown in FIG. 12, the electronic apparatus 2000 may further include ports that may communicate with a video card, a sound card, a memory card, a universal serial bus (USB) apparatus, other electronic apparatuses, or the like.

The bus 1700 refers to a transmission path for transmitting data, commands, addresses, or control signals between elements of the electronic apparatus 2000.

The processor 2100 may perform particular calculations or tasks. As an example, the processor 2100 may be a micro-processor or a CPU. The processor 2100 may control the memory 2200, the peripheral unit 2300, and the auxiliary power supply unit 2400 via the bus 2500 such as an address bus, a control bus, a data bus, or the like. According to an exemplary embodiment, the processor 2100 may be connected to an expansion bus such as a peripheral component interconnect (PCI) bus. The processor 2100 may generate control signals needed for an auxiliary power supply test and determine whether an auxiliary power supply is defective.

As an example, the processor 120 shown in FIG. 1 may be applied as the processor 2100.

The memory 2200 may be implemented as a DRAM or an SRAM. As another example, the memory 2200 may be implemented as an NVM. The memory 2200 stores data, commands, or program codes needed to operate the electronic apparatus 2000. As an example, the memory 2200 may store data, commands, or program codes needed to perform operations described with reference to the flowchart shown in FIG. 6 or 7.

The peripheral unit 2300 may include an input/output unit, an auxiliary memory unit, an external memory unit, or the like which are controlled by the processor 2100. As an example, the peripheral unit 2300 may include a memory unit, a display unit, a mobile device, a PDA, a camera, or the like.

The auxiliary power supply unit 2400 charges electric energy by using a main power supply and, if an abnormality has occurred in the main power supply, supplies auxiliary power, obtained based on the charged electric energy, to the system power supply line SPL. The auxiliary power supply unit 2400 charges electric energy by using a energy storage device while main power is normally supplied to the auxiliary power supply unit 2400. Additionally, the auxiliary power supply unit 2400 enables the main power supply to be output to the system power supply line SPL, and disables the auxiliary power, charged in the energy storage device, from being output to the system power supply line SPL. As an example, the auxiliary power supply unit 110A or 110B shown in FIG. 2 or 3 may be applied as the auxiliary power supply unit 2400.

Figure 13:
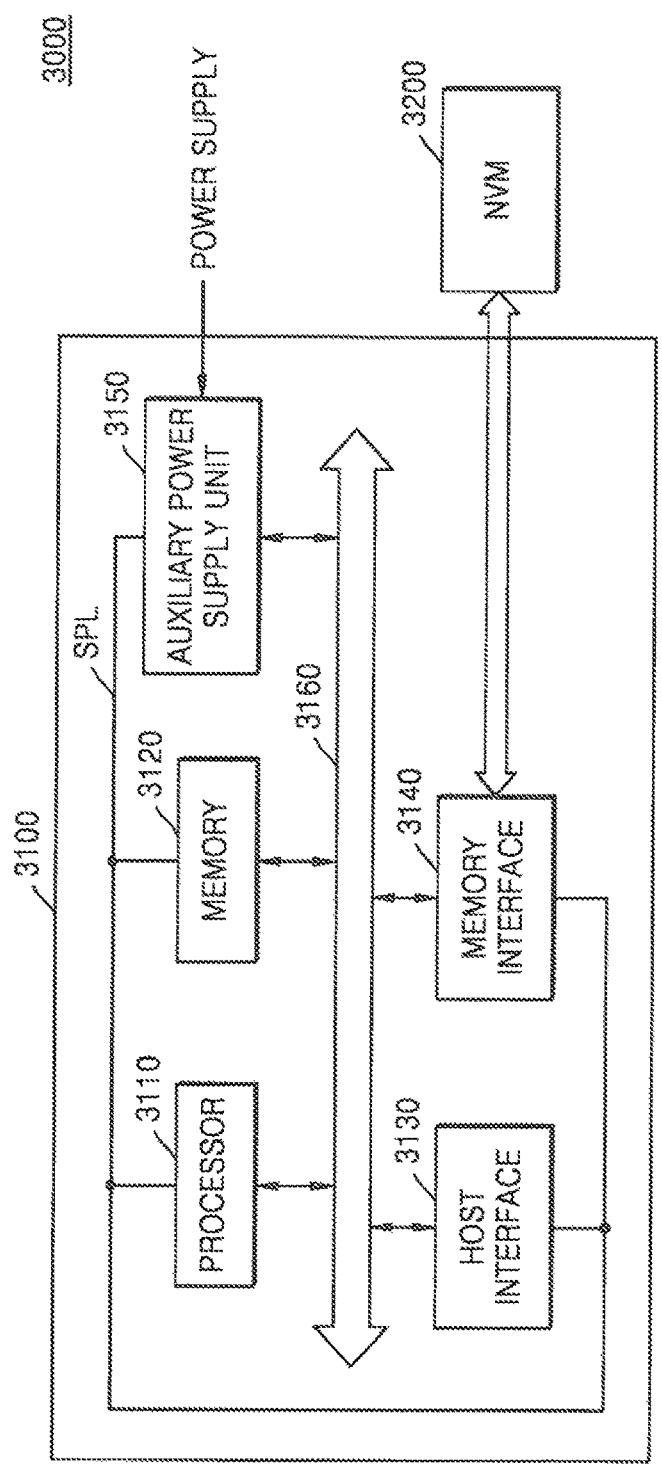
FIG. 13 illustrates a block diagram of an example of a memory system to which the auxiliary power test apparatus is applied, according to an exemplary embodiment.

FIG. 13 illustrates a block diagram of an example of a memory system 3000 to which the auxiliary power test apparatus is applied, according to an exemplary embodiment. As an example, the memory system 3000 may be a solid state drive (SSD).

Referring to FIG. 13, the memory system 3000 includes a memory controller 3100 and an NVM 3200.

The memory controller 3100 includes a processor 3110, a RAM 3120, a host interface 3130, a memory interface 3140, an auxiliary power supply unit 3150, and a bus 3160. Elements of the controller 3100 are electrically connected to each other via the bus 3160.

The RAM 3120 is a VM, and may be implemented as a DRAM and an SRAM. The RAM 3120 stores information or a program code needed to operate the memory system 3000. Additionally, the RAM 3120 may store data to be written to the NVM 3200 or data read from the NVM 3200. Additionally, the RAM 3120 may store program codes for performing the auxiliary power supply test method which was described with reference to the flowchart in FIG. 6 or 7.

The processor 3110 may perform a control operation in correspondence with a command received from a host by using the program codes and the data stored in the RAM 3120. In particular, a write command or a read command, received from a host, may be executed. Additionally, operations included in the auxiliary power supply test method, described with reference to FIG. 6 or 7, may be performed.

The host interface 3130 includes a protocol for exchanging data with a host connected to the memory controller 3100, and interfaces the memory controller 3100 and the host. The host interface 3130 may be implemented as, for example, an advanced technology attachment (ATA) interface, a serial advanced technology attachment (SATA) interface, a parallel advanced technology attachment (PATA) interface, a USB interface, a serial attached small computer system (SAS) interface, a small computer system interface (SCSI) interface, an embedded multimedia card (eMMC) interface, or a universal flash storage (UFS) interface. However, these are only examples, and the host interface 3130 is not limited thereto. The host interface 3130 may receive a command, an address, data from a host or transmit data to a host, according to control by the processor 3110.

The memory interface 3140 is electrically connected to the NVM 3200. The memory interface 3140 may transmit a command, an address, or data to the NVM 3200 or receive data from the NVM 3200, according to control by the processor 3110. The memory interface 3140 may be configured to a not and (NAND) flash memory or a not or (NOR) flash memory. The memory interface 3140 may be configured to perform software or hardware interleave operations via a plurality of channels.

The auxiliary power supply unit 3150 charges electric energy by using a main power supply and, if an abnormality has occurred in the main power supply, supplies auxiliary power to the system power supply line SPL based on the charged electric energy. The auxiliary power supply unit 3150 charges electric energy by using a energy storage device while main power is normally supplied to the auxiliary power supply 3150. Additionally, the auxiliary power supply unit 3150 enables the main power to be output to the system power supply line SPL and disables the auxiliary power supply, charged in the energy storage device, from being output to the system power supply line SPL. As an example, the auxiliary power supply unit 110A or 110B shown in FIG. 2 or 3 may be applied as the auxiliary power supply unit 3150.

The NVM memory unit 3200 may include one or more flash memory chips. As another example, the NVM 3200 may include a phase change RAM (PRAM) chip, a ferroelectric RAM (FRAM) chip, a magnetic RAM (MRAM) chip, or the like, as well as a flash memory chip.

While the inventive concept has been particularly shown and described with reference to exemplary embodiments thereof, it will be understood that various changes in form and details may be made therein without departing from the spirit and scope of the following claims.

What is claimed is:

1. A method of testing an auxiliary power supply unit, the method comprising:

applying a charging disable signal to the auxiliary power supply unit for a predetermined period of time, the charging disable signal disabling a charging operation of the auxiliary power supply unit;

monitoring a charging voltage of the auxiliary power supply unit during the predetermined period of time while the charging disable signal is applied to the auxiliary power supply unit; and determining whether the auxiliary power supply unit is defective in response to the monitored charging voltage falling below a predetermined threshold voltage during the predetermined period of time, wherein the auxiliary power supply unit is configured to supply auxiliary power that is generated in response to the charging voltage to a system power supply line in response to loss of a main power supply voltage.

2. The method of claim 1, wherein a length of the predetermined period of time in which the charging disable signal is generated is determined based on a length of a time interval in which a level of the charging voltage is to be maintained higher than a level of a proof voltage that is sufficient to operate as the auxiliary power.

3. The method of claim 1, wherein the predetermined threshold voltage is determined as a voltage level that is equal to or higher than a proof voltage available as the auxiliary power.

4. The method of claim 1, wherein a charging enable signal enabling the charging operation and a charging disable signal disabling the charging operation are repeatedly and alternately applied to the auxiliary power supply unit, and wherein the charging disable signal is applied to the auxiliary power supply unit after the auxiliary power supply unit reaches a fully charged state.

5. The method of claim 1, wherein, if the charging voltage is detected as being less than the predetermined threshold voltage in the predetermined period of time in which the charging disable signal is applied to the auxiliary power supply unit, it is determined that an open fault has occurred in an energy storage device on which the charging operation is performed by the auxiliary power supply unit.

6. The method of claim 1, wherein the charging operation by the auxiliary power supply unit is performed in a charging circuit that comprises one or more capacitors.

7. The method of claim 1, wherein the auxiliary power supply unit supplies auxiliary power to the system power supply line in response to a sudden loss of the main power supply voltage while the charging disable signal is applied to the auxiliary power supply unit.

8. An electronic apparatus comprising:
an auxiliary power supply unit configured to store electric energy and to supply auxiliary power to a system power supply line in response to a loss of a main power supply voltage; and
a processor configured to control operation of the auxiliary power supply unit and a memory unit using power supplied to the system power supply line,
wherein the processor repeatedly applies a charging enable signal and a charging disable signal to the auxiliary power supply unit,
determines whether a charging voltage of the auxiliary power supply unit is less than a predetermined threshold voltage during a time interval in which the charging disable signal is applied to the auxiliary power supply unit, and
generates a signal indicating whether the auxiliary power supply unit is defective in response to determining whether the charging voltage of the auxiliary power supply unit falls below the predetermined threshold voltage during the time interval in which the charging disable signal is applied to the auxiliary power supply unit.

9. The electronic apparatus of claim 8, wherein the time interval comprises a first time interval, and wherein the auxiliary power supply unit comprises:
a charging circuit configured to store electric energy;
a current control circuit configured to supply current to the charging circuit and/or to manage a current path for supplying current from the charging circuit to the system power supply line; and
a voltage detector configured to detect whether the charging voltage is less than a predetermined threshold voltage and to generate an auxiliary power supply interrupt signal,
wherein the current control circuit enables a supply of current to the charging circuit during a second time interval in which the charging enable signal is applied to the auxiliary power supply unit, and disables the supply of current to the charging circuit during the first time interval in which the charging disable signal is applied to the auxiliary power supply unit, and
wherein the processor generates a signal indicating that the auxiliary power supply unit is defective in response to the auxiliary power supply interrupt signal.

10. The electronic apparatus of claim 9, wherein the charging circuit comprises one or more capacitors.

11. The electronic apparatus of claim 9, wherein the current control circuit comprises a circuit configured to:
supply current generated using electric energy stored in the charging circuit to the system power supply line in response to the loss of the main power supply voltage, and
disable the supply of current from the charging circuit to the system power supply line in a third time interval in which main power supply voltage is supplied to the system power supply line.

12. The electronic apparatus of claim 8, wherein the processor determines a length of the time interval in which the charging disable signal is applied to the auxiliary power supply unit based on a length of time in which a level of the charging voltage is to be maintained equal to or higher than a level of a proof voltage that may operate as the auxiliary power in the memory unit.

13. The electronic apparatus of claim 8, wherein the processor applies the charging disable signal to the auxiliary power supply unit after the auxiliary power supply unit reaches a fully charged state.

14. The electronic apparatus of claim 8, wherein the predetermined threshold voltage is determined as a voltage level that is equal to or higher than a level of a proof voltage available as an auxiliary power supply to the memory unit.

15. The electronic apparatus of claim 8, wherein, if the auxiliary power supply unit is determined as being defective, the processor continuously applies the charging disable signal to the auxiliary power supply unit.

16. The electronic apparatus of claim 9, wherein the current control circuit comprises:
a first unidirectional device that couples a power supply line to the system power supply line;
a current limiter coupled between the system power supply line and a charging node coupled to the charging circuit; and
a second unidirectional device that couples the charging node to the system power supply line;
wherein the voltage detector is coupled to the charging node.

17. The electronic apparatus of claim 16, further comprising:
a boost converter coupled between the current limiter and the charging node and configured to boost a voltage applied to the charging node through the current limiter; and
a buck converter coupled between the charging node and the second unidirectional device and configured to reduce a voltage applied to the system power supply line from the charging node through the second unidirectional device.

18. A method of operating an auxiliary power supply unit, the method comprising:
transmitting a charging disable signal to the auxiliary power supply unit, the charging disable signal disabling a charging operation of the auxiliary power supply unit;
starting a timer;
monitoring a charging voltage generated by the auxiliary power supply unit;

determining if a value of the timer is greater than a timer threshold value;

in response to determining that the value of the timer is greater than the timer threshold value, applying a charging enable signal to the auxiliary power supply unit, the charging enable signal enabling the charging operation of the auxiliary power supply unit;

in response to determining that the value of the timer is less than the timer threshold value, determining if the charging voltage of the auxiliary power supply unit has fallen below a predetermined threshold voltage; and in response to determining that the charging voltage of the auxiliary power supply unit has fallen below the predetermined threshold voltage, generating a backup fail signal BUP_FA that indicates that the auxiliary power supply unit is defective.

19. The method of claim 18, wherein the charging operation by the auxiliary power supply unit is performed in a charging circuit that comprises one or more capacitors.

20. The method of claim 18, further comprising supplying auxiliary power to a system power supply line in response to a loss of a main power supply voltage while the charging disable signal is applied to the auxiliary power supply unit.

\* \* \* \* \*